United States Patent
Tsukamoto et al.

(10) Patent No.: US 10,263,600 B2
(45) Date of Patent: Apr. 16, 2019

(54) BAND-PASS FILTER AND BRANCHING FILTER

(71) Applicant: TDK CORPORATION, Tokyo (JP)

(72) Inventors: Kazuhiro Tsukamoto, Tokyo (JP); Hiroya Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 193 days.

(21) Appl. No.: 15/355,443

(22) Filed: Nov. 18, 2016

(65) Prior Publication Data

US 2017/0214390 A1 Jul. 27, 2017

(30) Foreign Application Priority Data

Jan. 25, 2016 (JP) .................................. 2016-011395

(51) Int. Cl.
| | | |
|---|---|---|
| *H03H 9/54* | (2006.01) | |
| *H03H 7/01* | (2006.01) | |
| *H03H 9/70* | (2006.01) | |
| *H03H 9/72* | (2006.01) | |
| *H03H 9/64* | (2006.01) | |

(52) U.S. Cl.
CPC .......... *H03H 9/542* (2013.01); *H03H 7/1758* (2013.01); *H03H 7/1766* (2013.01); *H03H 7/1775* (2013.01); *H03H 9/64* (2013.01); *H03H 9/703* (2013.01); *H03H 9/706* (2013.01); *H03H 9/72* (2013.01); *H03H 9/725* (2013.01)

(58) Field of Classification Search
CPC ........ H03H 7/075; H03H 7/175; H03H 9/542; H03H 9/64; H03H 9/703; H03H 9/72; H03H 7/1775; H03H 7/1766; H03H 9/725

USPC .......................... 333/133, 187, 188, 193–196
See application file for complete search history.

(56) References Cited

U.S. PATENT DOCUMENTS

| | | | |
|---|---|---|---|
| 6,756,864 B2 | 6/2004 | Muramatsu | |
| 7,683,736 B2 | 3/2010 | Inoue et al. | |
| 2005/0281210 A1 | 12/2005 | Makino | |
| 2011/0187478 A1 | 8/2011 | Link et al. | |
| 2012/0274417 A1* | 11/2012 | Kihara | ..................... H03H 7/38 333/133 |

(Continued)

FOREIGN PATENT DOCUMENTS

| | | |
|---|---|---|
| DE | 102004052210 A1 | 6/2005 |
| DE | 102008045346 A1 | 3/2010 |

(Continued)

OTHER PUBLICATIONS

Dec. 8, 2017 Office Action issued in German Patent Application No. 102017101400.4.

*Primary Examiner* — Robert J Pascal
*Assistant Examiner* — Jorge L Salazar, Jr.
(74) *Attorney, Agent, or Firm* — Oliff PLC

(57) ABSTRACT

A branching filter includes a first band-pass filter provided between a common port and a first signal port, and a second band-pass filter provided between the common port and a second signal port. The first band-pass filter includes a first LC resonant circuit and a first resonant circuit section provided in series. The first resonant circuit section includes a first acoustic wave resonator. The second band-pass filter includes a second LC resonant circuit and a second resonant circuit section provided in series. The second resonant circuit section includes a second acoustic wave resonator and an inductor connected in parallel.

14 Claims, 9 Drawing Sheets

(56) References Cited

U.S. PATENT DOCUMENTS

2015/0054597 A1* 2/2015 Yasuda ................ H03H 9/542
　　　　　　　　　　　　　　　　　　　　333/133

FOREIGN PATENT DOCUMENTS

JP　　　2010-141859 A　　6/2010
JP　　　2015-115866 A　　6/2015

* cited by examiner

BAND-PASS FILTER AND BRANCHING FILTER

BACKGROUND OF THE INVENTION

1. Field of the Invention

The present invention relates to a band-pass filter, and a branching filter including the band-pass filter.

2. Description of the Related Art

Mobile communication systems conforming to the Long Term Evolution (LTE) standard have become practically used in recent years, and further, practical use of mobile communication systems conforming to the LTE-Advanced standard, which is an evolution of the LTE standard, is under study. Carrier Aggregation (CA) is one of the key technologies of the LTE-Advanced standard. CA uses multiple carriers called component carriers simultaneously to enable wideband transmission.

A mobile communication apparatus operable under CA uses multiple frequency bands simultaneously. Accordingly, such a mobile communication apparatus requires a branching filter capable of separating a plurality of signals in a plurality of frequency bands from each other simultaneously.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. Examples of the first filter include a low-pass filter and a band-pass filter, and examples of the second filter include a high-pass filter and a band-pass filter.

A branching filter that uses a band-pass filter as the first or second filter has an advantage in its capability of increasing attenuation outside the first frequency band in the first signal path and increasing attenuation outside the second frequency band in the second signal path.

Among known band-pass filters are LC filters formed using inductors and capacitors, and acoustic wave filters formed using acoustic wave resonators. The acoustic wave resonators are resonators formed using acoustic wave elements. The acoustic wave elements are elements that use acoustic waves. The acoustic wave elements include surface acoustic wave elements using surface acoustic waves, and bulk acoustic wave elements using bulk acoustic waves.

JP-2010-141859A discloses a branching filter (diplexer) including two band-pass filters each composed of an LC filter.

JP-2015-115866A discloses a branching filter including two band-pass filters each composed of an acoustic wave filter.

Mobile communication apparatuses may require a branching filter for separating two signals in two mutually relatively close frequency bands from each other. Such a branching filter requires a filter having an insertion loss characteristic that abruptly changes in a frequency region close to the cut-off frequency.

It is typically difficult for LC filters to provide an insertion loss characteristic that abruptly changes in a frequency region close to the cut-off frequency.

On the other hand, while acoustic wave filters are suitable to achieve an insertion loss characteristic that abruptly changes in a frequency region close to the cut-off frequency, they are not suitable to provide a wide passband.

Thus, it has conventionally been difficult to provide a branching filter suitable to separate two signals in two mutually relatively close frequency bands from each other, and to provide a band-pass filter suitable for use in such a branching filter.

SUMMARY OF THE INVENTION

It is a first object of the present invention to provide a band-pass filter having an insertion loss characteristic that abruptly changes in a frequency region close to the cut-off frequency.

It is a second object of the present invention to provide a branching filter that is suitable to separate two signals in two mutually relatively close frequency bands from each other.

A band-pass filter of the present invention is configured to selectively pass a signal of a frequency within a passband not lower than a low-band cut-off frequency and not higher than a high-band cut-off frequency. The band-pass filter of the present invention includes: a first port; a second port; and an LC resonant circuit and a resonant circuit section provided in series between the first port and the second port.

The resonant circuit section includes at least one acoustic wave resonator provided in a path leading from the first port to the second port. The resonant circuit section has a resonant frequency and at least one anti-resonant frequency. The resonant frequency is within the passband. The at least one anti-resonant frequency is outside the passband.

In the band-pass filter of the present invention, the at least one anti-resonant frequency may be higher than the high-band cut-off frequency. In this case, the resonant circuit section may include two acoustic wave resonators connected in series, as the at least one acoustic wave resonator.

In the band-pass filter of the present invention, the resonant circuit section may further include at least one inductor connected in parallel to the at least one acoustic wave resonator. The resonant circuit section may have an anti-resonant frequency lower than the low-band cut-off frequency and an anti-resonant frequency higher than the high-band cut-off frequency, as the at least one anti-resonant frequency. The resonant circuit section in this case may include, as the at least one acoustic wave resonator, two acoustic wave resonators connected in series, and as the at least one inductor, two inductors respectively connected in parallel to the two acoustic wave resonators.

In the band-pass filter of the present invention, the LC resonant circuit may be an LC parallel resonant circuit having a resonant frequency outside the passband.

A branching filter of a first to a third aspect of the present invention includes a common port, a first signal port, a second signal port, a first filter, and a second filter. The first filter is provided between the common port and the first signal port, and configured to selectively pass a signal of a frequency within a first passband. The second filter is provided between the common port and the second signal port, and configured to selectively pass a signal of a frequency within a second passband higher than the first passband.

In the branching filter of the first aspect of the present invention, the first filter is a first band-pass filter. The first passband is a frequency band that is not lower than a first low-band cut-off frequency and not higher than a first high-band cut-off frequency. The first band-pass filter includes a first LC resonant circuit and a first resonant circuit section between the common port and the first signal port, the first LC resonant circuit and the first resonant circuit section being arranged in series in this order from the common-port side. The first resonant circuit section includes at least one acoustic wave resonator provided in a path leading from the first LC resonant circuit to the first signal port. The first resonant circuit section has a resonant frequency within the first passband and at least one anti-resonant frequency higher than the first high-band cut-off frequency.

In the branching filter of the first aspect of the present invention, the first resonant circuit section may include two acoustic wave resonators connected in series, as the at least one acoustic wave resonator.

In the branching filter of the first aspect of the present invention, the first LC resonant circuit may be a first LC parallel resonant circuit having a resonant frequency higher than the first high-band cut-off frequency.

In the branching filter of the second aspect of the present invention, the second filter is a second band-pass filter. The second passband is a frequency band that is not lower than a second low-band cut-off frequency and not higher than a second high-band cut-off frequency. The second band-pass filter includes a second LC resonant circuit and a second resonant circuit section between the common port and the second signal port, the second LC resonant circuit and the second resonant circuit section being arranged in series in this order from the common-port side. The second resonant circuit section includes at least one acoustic wave resonator provided in a path leading from the second LC resonant circuit to the second signal port, and at least one inductor connected in parallel to the at least one acoustic wave resonator. The second resonant circuit section has a resonant frequency within the second passband, an anti-resonant frequency lower than the second low-band cut-off frequency, and an anti-resonant frequency higher than the second high-band cut-off frequency.

In the branching filter of the second aspect of the present invention, the second resonant circuit section may include, as the at least one acoustic wave resonator, two acoustic wave resonators connected in series, and as the at least one inductor, two inductors respectively connected in parallel to the two acoustic wave resonators.

In the branching filter of the second aspect of the present invention, the second LC resonant circuit may be a second LC parallel resonant circuit having a resonant frequency lower than the second low-band cut-off frequency.

In the branching filter of the third aspect of the present invention, the first filter is a first band-pass filter. The first passband is a frequency band that is not lower than a first low-band cut-off frequency and not higher than a first high-band cut-off frequency. The first band-pass filter includes a first LC resonant circuit and a first resonant circuit section between the common port and the first signal port, the first LC resonant circuit and the first resonant circuit section being arranged in series in this order from the common-port side. The first resonant circuit section includes at least one first acoustic wave resonator provided in a path leading from the first LC resonant circuit to the first signal port. The first resonant circuit section has a resonant frequency within the first passband and at least one anti-resonant frequency higher than the first high-band cut-off frequency.

In the branching filter of the third aspect of the present invention, the second filter is a second band-pass filter. The second passband is a frequency band that is not lower than a second low-band cut-off frequency and not higher than a second high-band cut-off frequency. The second band-pass filter includes a second LC resonant circuit and a second resonant circuit section between the common port and the second signal port, the second LC resonant circuit and the second resonant circuit section being arranged in series in this order from the common-port side. The second resonant circuit section includes at least one second acoustic wave resonator provided in a path leading from the second LC resonant circuit to the second signal port, and at least one inductor connected in parallel to the at least one second acoustic wave resonator. The second resonant circuit section has a resonant frequency within the second passband, an anti-resonant frequency lower than the second low-band cut-off frequency, and an anti-resonant frequency higher than the second high-band cut-off frequency.

In the branching filter of the third aspect of the present invention, the first resonant circuit section may include two first acoustic wave resonators connected in series, as the at least one first acoustic wave resonator. The second resonant circuit section may include, as the at least one second acoustic wave resonator, two second acoustic wave resonators connected in series, and as the at least one inductor, two inductors respectively connected in parallel to the two acoustic wave resonators.

In the branching filter of the third aspect of the present invention, the first LC resonant circuit may be a first LC parallel resonant circuit having a resonant frequency higher than the first high-band cut-off frequency, and the second LC resonant circuit may be a second LC parallel resonant circuit having a resonant frequency lower than the second low-band cut-off frequency.

The band-pass filter of the present invention includes the resonant circuit section including at least one acoustic wave resonator. The resonant frequency of the resonant circuit section is within the passband, and the at least one anti-resonant frequency of the resonant circuit section is outside the passband. By virtue of this configuration, the band-pass filter of the present invention provides an insertion loss characteristic that abruptly changes in a frequency region close to the low-band or high-band cut-off frequency.

In the branching filter of the first aspect of the present invention, the first band-pass filter or the first filter corresponds to the band-pass filter of the present invention. The branching filter of the first aspect of the present invention enables the first band-pass filter to provide an insertion loss characteristic that abruptly changes in a frequency region close to the first high-band cut-off frequency.

In the branching filter of the second aspect of the present invention, the second band-pass filter or the second filter corresponds to the band-pass filter of the present invention. The branching filter of the second aspect of the present invention enables the second band-pass filter to provide an insertion loss characteristic that abruptly changes in a frequency region close to the second low-band cut-off frequency.

In the branching filter of the third aspect of the present invention, the first band-pass filter or the first filter, and the second band-pass filter or the second filter both correspond to the band-pass filter of the present invention. The branching filter of the third aspect of the present invention enables the first band-pass filter to provide an insertion loss characteristic that abruptly changes in a frequency region close to the first high-band cut-off frequency, and also enables the second band-pass filter to provide an insertion loss characteristic that abruptly changes in a frequency region close to the second low-band cut-off frequency.

Thus, the first to third aspects of the present invention provide a branching filter suitable to separate two signals in two mutually relatively close frequency bands from each other.

Other and further objects, features and advantages of the invention will appear more fully from the following description.

DETAILED DESCRIPTION OF THE PREFERRED EMBODIMENTS

First Embodiment

Figure 1:
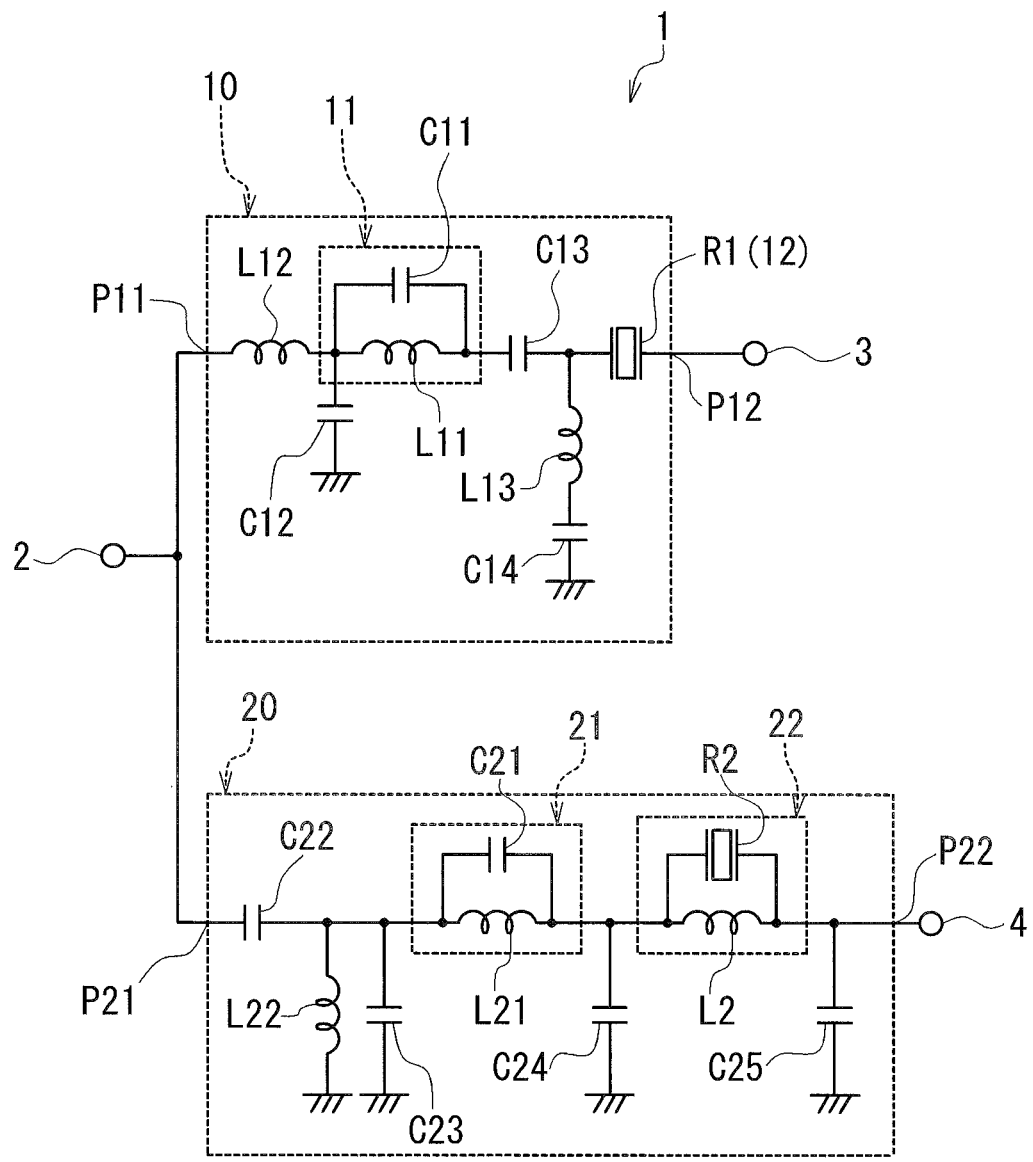
FIG. 1 is a circuit diagram illustrating the configuration of a branching filter according to a first embodiment of the invention.

Preferred embodiments of the present invention will now be described in detail with reference to the drawings. First, the configuration of a branching filter according to a first embodiment of the invention will be outlined with reference to FIG. 1. The branching filter 1 according to the first embodiment includes a common port 2, a first signal port 3, a second signal port 4, a first filter 10, and a second filter 20.

The first filter 10 is provided between the common port 2 and the first signal port 3, and configured to selectively pass a signal of a frequency within a first passband. The second filter 20 is provided between the common port 2 and the second signal port 4, and configured to selectively pass a signal of a frequency within a second passband higher than the first passband.

In the first embodiment, the first filter 10 is particularly a first band-pass filter, and the second filter 20 is particularly a second band-pass filter. Hereinafter, the first filter 10 will also be referred to as the first band-pass filter 10, and the second filter 20 will also be referred to as the second band-pass filter 20.

Figure 3:
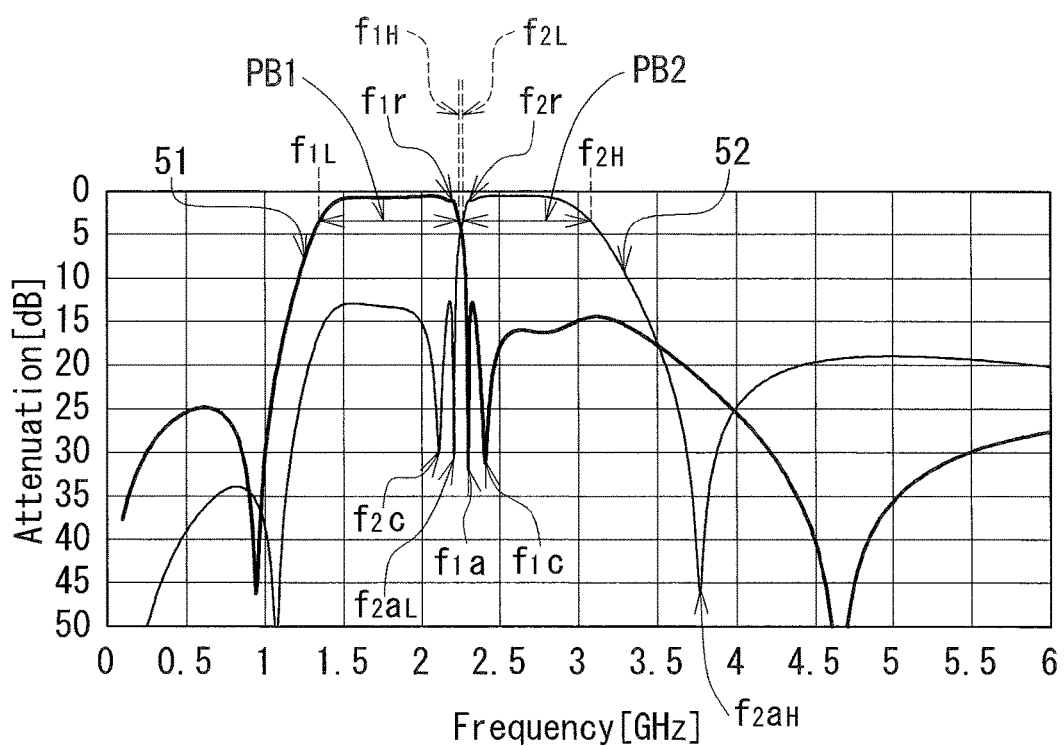
FIG. 3 is a characteristic diagram illustrating an example of characteristics of the branching filter according to the first embodiment of the invention.
Figure 4:
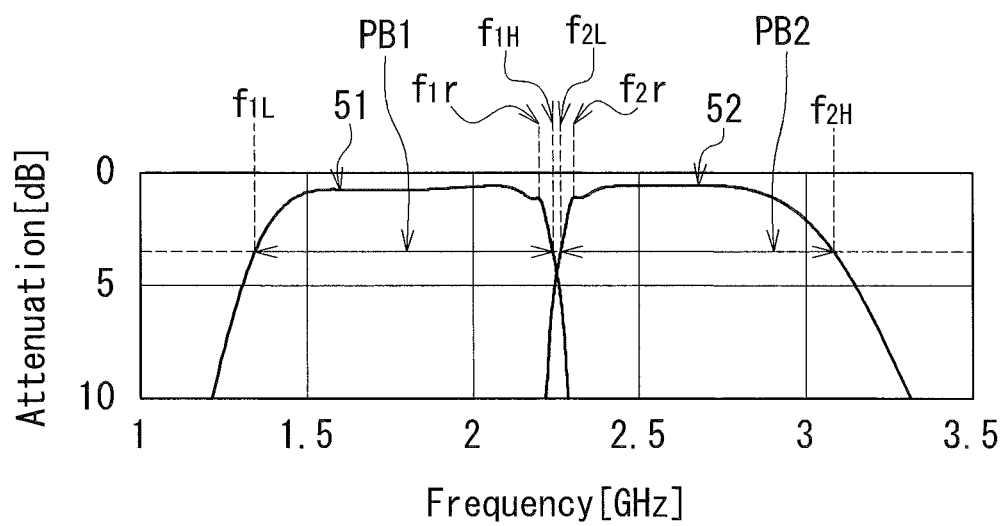
FIG. 4 is a characteristic diagram providing an enlarged view of a portion of the characteristic shown in FIG. 3.

The first passband and the second passband will now be described with reference to FIGS. 3 and 4. FIG. 3 is a characteristic diagram illustrating an example of characteristics of the branching filter 1. FIG. 4 is a characteristic diagram providing an enlarged view of a portion of the characteristic shown in FIG. 3. In FIGS. 3 and 4, the horizontal axis represents frequency, and the vertical axis represents attenuation. In FIGS. 3 and 4, the curve 51 shows the insertion loss characteristic of the first band-pass filter 10, and the curve 52 shows the insertion loss characteristic of the second band-pass filter 20. The characteristics shown in FIGS. 3 and 4 were determined by simulation. In FIGS. 3 and 4, the symbol PB1 represents the first passband, and the symbol PB2 represents the second passband.

The first passband PB1 is a frequency band that is not lower than a first low-band cut-off frequency $f_{1L}$ and not higher than a first high-band cut-off frequency $f_{1H}$. The first low-band cut-off frequency $f_{1L}$ and the first high-band cut-off frequency $f_{1H}$ are two frequencies at which the insertion loss characteristic of the first band-pass filter 10 shows an increase of attenuation by 3 dB compared with the minimum value of attenuation. The first high-band cut-off frequency $f_{1H}$ is higher than the first low-band cut-off frequency $f_{1L}$.

The second passband PB2 is a frequency band that is not lower than a second low-band cut-off frequency $f_{2L}$ and not higher than a second high-band cut-off frequency $f_{2H}$. The second low-band cut-off frequency $f_{2L}$ and the second high-band cut-off frequency $f_{2H}$ are two frequencies at which the insertion loss characteristic of the second band-pass filter 20 shows an increase of attenuation by 3 dB compared with the minimum value of attenuation. The second high-band cut-off frequency $f_{2H}$ is higher than the second low-band cut-off frequency $f_{2L}$. The second low-band cut-off frequency $f_{2L}$ is higher than the first high-band cut-off frequency $f_{1H}$.

Now, the configurations of the first and second band-pass filters 10 and 20 will be described in detail with reference to FIG. 1.

The first band-pass filter 10 includes a first port P11 and a second port P12. The first port P11 is connected to the common port 2. The second port P12 is connected to the first signal port 3.

The first band-pass filter 10 further includes a first LC resonant circuit 11 and a first resonant circuit section 12 provided in series between the first port P11 and the second port P12. More specifically, the first LC resonant circuit 11 and the first resonant circuit section 12 are arranged in series in this order from the first-port-P11 side between the first port P11 and the second port P12. Thus, it can also be said that the first LC resonant circuit 11 and the first resonant circuit section 12 are provided between the common port 2 and the first signal port 3 and arranged in series in this order from the common-port-2 side.

The first LC resonant circuit 11 is a resonant circuit formed using an inductor and a capacitor. In the first embodiment, the first LC resonant circuit 11 is particularly a first LC parallel resonant circuit including an inductor L11 and a capacitor C11 provided in parallel between the first port P11 and the second port P12, that is, between the common port 2 and the first signal port 3.

The first resonant circuit section 12 includes at least one first acoustic wave resonator provided in a path leading from the first port P11 to the second port P12. More specifically, the at least one first acoustic wave resonator is provided in a path leading from the first LC resonant circuit 11 to the second port P12, that is, a path leading from the first LC resonant circuit 11 to the first signal port 3. In the first embodiment, the first resonant circuit section 12 is particularly formed of one first acoustic wave resonator R1.

The first acoustic wave resonator R1 is a resonator formed using an acoustic wave element. The acoustic wave element is an element that uses acoustic waves. The acoustic wave element used to form the first acoustic wave resonator R1 may be a surface acoustic wave element using surface acoustic waves or a bulk acoustic wave element using bulk acoustic waves. The surface acoustic wave element uses surface acoustic waves, i.e., acoustic waves that propagate across the surface of a piezoelectric material, whereas the bulk acoustic wave element uses bulk acoustic waves, i.e., acoustic waves that propagate internally through a piezoelectric material.

The first band-pass filter 10 further includes inductors L12 and L13 and capacitors C12, C13 and C14. The inductor L12 is provided between the first port P11 and the first LC resonant circuit 11. The capacitor C12 is provided between the ground and the connection point between the inductor L12 and the first LC resonant circuit 11. The capacitor C13 is provided between the first LC resonant circuit 11 and the first acoustic wave resonator R1. One end of the inductor L13 is connected to the connection point between the capacitor C13 and the first acoustic wave resonator R1. One end of the capacitor C14 is connected to the other end of the inductor L13. The other end of the capacitor C14 is connected to the ground.

The second band-pass filter 20 includes a first port P21 and a second port P22. The first port P21 is connected to the common port 2. The second port P22 is connected to the second signal port 4.

The second band-pass filter 20 further includes a second LC resonant circuit 21 and a second resonant circuit section 22 provided in series between the first port P21 and the second port P22. More specifically, the second LC resonant circuit 21 and the second resonant circuit section 22 are arranged in series in this order from the first-port-P21 side between the first port P21 and the second port P22. Thus, it can also be said that the second LC resonant circuit 21 and the second resonant circuit section 22 are provided between the common port 2 and the second signal port 4 and arranged in series in this order from the common-port-2 side.

The second LC resonant circuit 21 is a resonant circuit formed using an inductor and a capacitor. In the first embodiment, the second LC resonant circuit 21 is particularly a second LC parallel resonant circuit including an inductor L21 and a capacitor C21 provided in parallel between the first port P21 and the second port P22, that is, between the common port 2 and the second signal port 4.

The second resonant circuit section 22 includes at least one second acoustic wave resonator provided in a path leading from the first port P21 to the second port P22. More specifically, the at least one second acoustic wave resonator is provided in a path leading from the second LC resonant circuit 21 to the second port P22, that is, a path leading from the second LC resonant circuit 21 to the second signal port 4. The second resonant circuit section 22 further includes at least one inductor connected in parallel to the at least one second acoustic wave resonator. In the first embodiment, the second resonant circuit section 22 is particularly composed of one second acoustic wave resonator R2 and one inductor L2 connected in parallel to the second acoustic wave resonator R2.

The second acoustic wave resonator R2 is a resonator formed using an acoustic wave element, as is the first acoustic wave resonator R1. The acoustic wave element used to form the second acoustic wave resonator R2 may be a surface acoustic wave element or a bulk acoustic wave element.

The second band-pass filter 20 further includes an inductor L22 and capacitors C22, C23, C24 and C25. The capacitor C22 is provided between the first port P21 and the second LC resonant circuit 21. The inductor L22 and the capacitor C23 are provided in parallel between the ground and the connection point between the capacitor C22 and the second LC resonant circuit 21. The capacitor C24 is provided between the ground and the connection point between the second LC resonant circuit 21 and the second resonant circuit section 22. The capacitor C25 is provided between the second port P22 and the ground.

Now, the path leading from the common port 2 to the first signal port 3 will be referred to as the first signal path, and the path leading from the common port 2 to the second signal port 4 will be referred to as the second signal path. A first signal of a frequency within the first passband PB1 selectively passes through the first signal path and not through the second signal path. A second signal of a frequency within the second passband PB2 selectively passes through the second signal path and not through the first signal path. In this way, the branching filter 1 separates the first signal and the second signal from each other.

Figure 2:
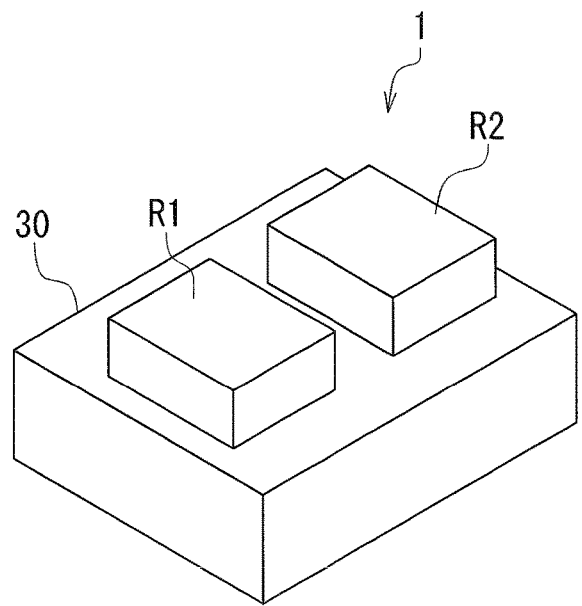
FIG. 2 is a perspective view illustrating an example of the external appearance of the branching filter according to the first embodiment of the invention.

FIG. 2 is a perspective view illustrating an example of the external appearance of the branching filter 1. The branching filter 1 of this example includes a stack 30 and the first and second acoustic wave resonators R1 and R2. The stack 30 is shaped like a rectangular solid and has a periphery. The periphery of the stack 30 includes a top surface, a bottom surface and four side surfaces.

The stack 30 includes dielectric layers and conductor layers stacked on each other. Components of the branching filter 1 other than the first and second acoustic wave resonators R1 and R2 are formed using the dielectric layers and conductor layers of the stack 30. The first and second acoustic wave resonators R1 and R2 are mounted on the top surface of the stack 30. The first and second acoustic wave resonators R1 and R2 may be combined into a package and the package may be mounted on the top surface of the stack 30.

Although not illustrated, three terminals corresponding to the common port 2, the first signal port 3 and the second signal port 4, and a terminal to be connected to the ground are provided on the bottom surface of the stack 30.

The features of the branching filter 1 will now be described with reference to FIGS. 3 to 9. First, the features of the first band-pass filter 10 will be described. In the first band-pass filter 10, the first LC resonant circuit 11 has a resonant frequency $f_{1C}$ outside the first passband PB1. In the present embodiment, the resonant frequency $f_{1C}$ is higher than the first high-band cut-off frequency $f_{1H}$.

The first resonant circuit section 12, i.e., the first acoustic wave resonator R1 has one resonant frequency $f_{1r}$ and one anti-resonant frequency $f_{1a}$. The resonant frequency $f_{1r}$ is a frequency at which the first acoustic wave resonator R1 has a minimum impedance (maximum admittance). The anti-resonant frequency $f_{1a}$ is a frequency at which the first acoustic wave resonator R1 has a minimum admittance (maximum impedance). The anti-resonant frequency $f_{1a}$ is higher than the resonant frequency $f_{1r}$.

Figure 5:
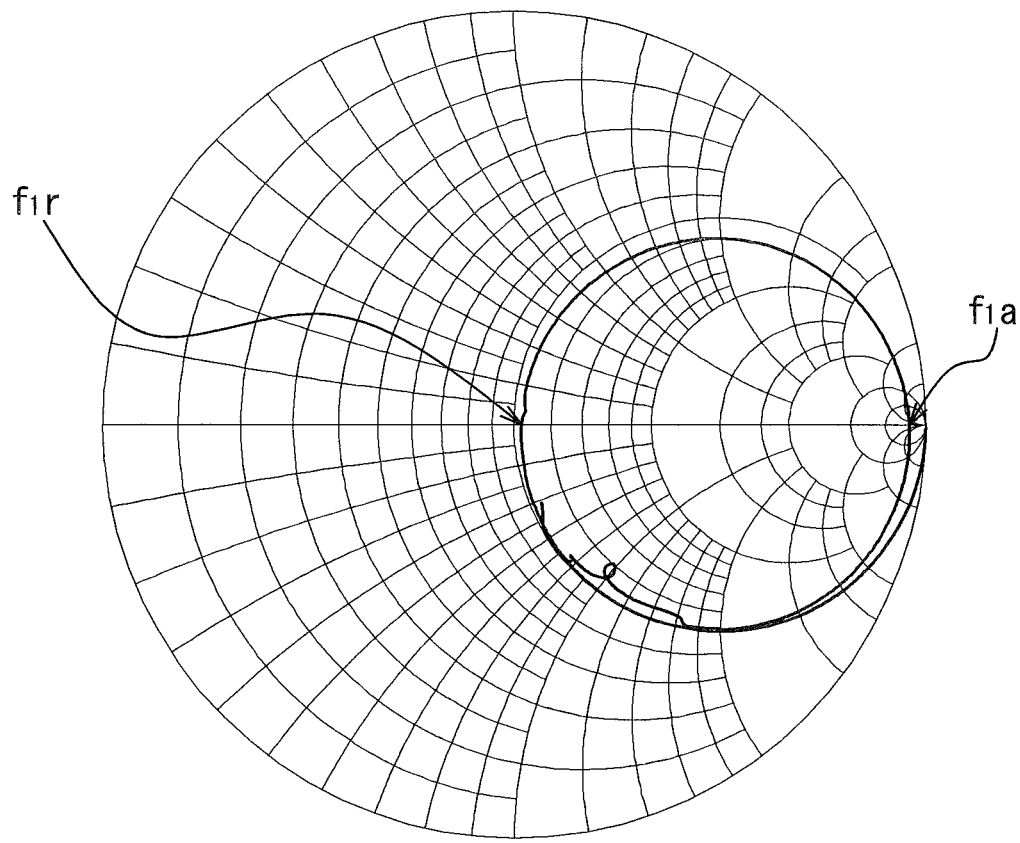
FIG. 5 is an explanatory diagram illustrating an impedance characteristic of a first acoustic wave resonator of the branching filter shown in FIG. 1.

FIG. 5 is a Smith chart showing the impedance characteristic of the first acoustic wave resonator R1. In FIG. 5, the point $f_{1r}$ indicates the impedance of the first acoustic wave resonator R1 at the resonant frequency $f_{1r}$, and the point $f_{1a}$ indicates the impedance of the first acoustic wave resonator R1 at the anti-resonant frequency $f_{1a}$.

Figure 6:
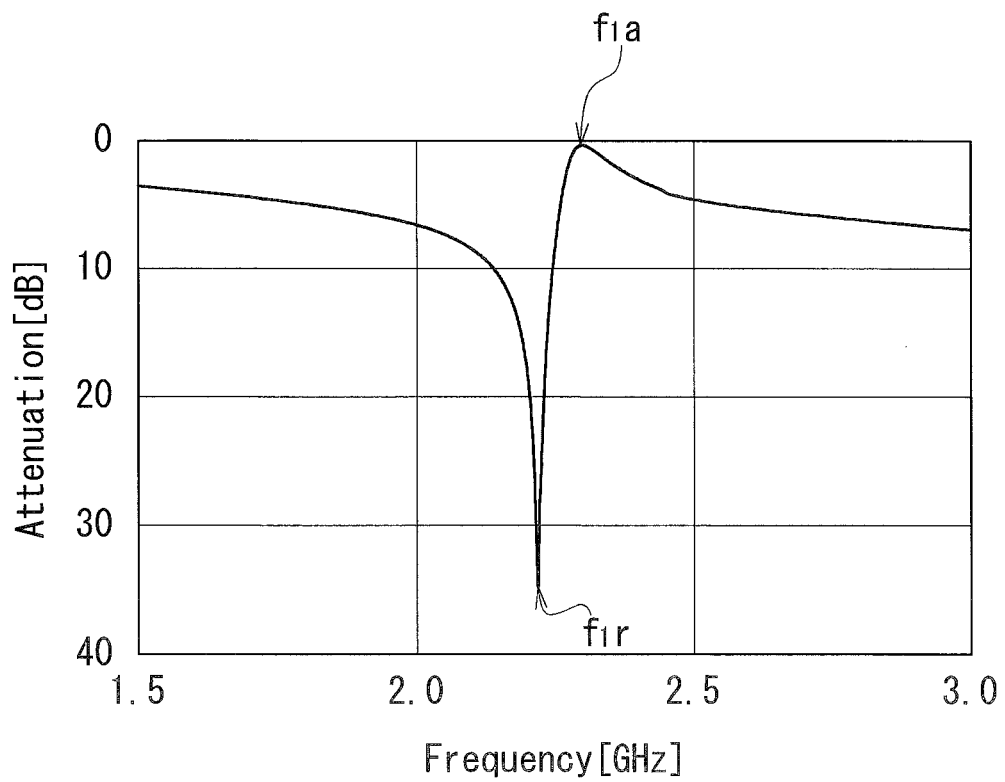
FIG. 6 is a characteristic diagram illustrating the characteristic of the first acoustic wave resonator of the branching filter shown in FIG. 1.

FIG. 6 illustrates the return loss characteristic of the first acoustic wave resonator R1. In FIG. 6 the horizontal axis represents frequency, and the vertical axis represents attenuation. In FIG. 6, the point $f_{1r}$ indicates the return loss of the first acoustic wave resonator R1 at the resonant frequency $f_{1r}$, and the point $f_{1a}$ indicates the return loss of the first acoustic wave resonator R1 at the anti-resonant frequency $f_{1a}$.

As shown in FIGS. 3 and 4, the resonant frequency $f_{1r}$ of the first acoustic wave resonator R1 is within the first passband PB1. The anti-resonant frequency $f_{1a}$ of the first acoustic wave resonator R1 is higher than the first high-band cut-off frequency $f_{1H}$. The insertion loss characteristic 51 of the first band-pass filter 10 shows a first attenuation pole at the anti-resonant frequency $f_{1a}$. The resonant frequency $f_{1C}$ of the first LC resonant circuit 11 is higher than the anti-resonant frequency $f_{1a}$. The insertion loss characteristic 51 of the first band-pass filter 10 shows a second attenuation pole at the resonant frequency $f_{1C}$.

The resonant frequency $f_{1r}$ and the anti-resonant frequency $f_{1a}$ are relatively close to each other. Thus, setting the resonant frequency $f_{1r}$ and the anti-resonant frequency $f_{1a}$ as above makes the resonant frequency $f_{1r}$ be located within the first passband PB1 and close to the first high-band cut-off frequency $f_{1H}$, and makes the anti-resonant frequency $f_{1a}$ be located outside the first passband PB1 and close to the first high-band cut-off frequency $f_{1H}$. As a result, as shown in FIGS. 3 and 4, in a frequency region close to the first high-band cut-off frequency $f_{1H}$, the first band-pass filter 10 provides a small insertion loss at the resonant frequency $f_{1r}$ which is within the first passband PB1 and a large insertion loss at the anti-resonant frequency $f_{1a}$ which is outside the first passband PB1. The first band-pass filter 10 thus has an insertion loss characteristic that shows a small insertion loss in the first passband PB1 and that abruptly changes in a frequency region close to the first high-band cut-off frequency $f_{1H}$.

Next, the features of the second band-pass filter 20 will be described. In the second band-pass filter 20, the second LC resonant circuit 21 has a resonant frequency $f_{2C}$ outside the second passband PB2. In the present embodiment, the resonant frequency $f_{2C}$ is lower than the second low-band cut-off frequency $f_{2L}$.

The second resonant circuit section 22 has one resonant frequency $f_{2r}$ and two anti-resonant frequencies $f_{2aL}$ and $f_{2aH}$. The anti-resonant frequency $f_{2aL}$ is lower than the resonant frequency $f_{2r}$. The anti-resonant frequency $f_{2aH}$ is higher than the resonant frequency $f_{2r}$.

Figure 7:
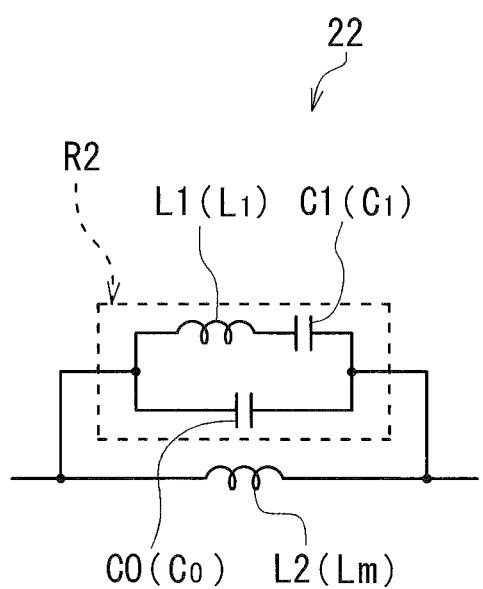
FIG. 7 is a circuit diagram illustrating an equivalent circuit of a second resonant circuit section of the branching filter shown in FIG. 1.

Reference is now made to FIG. 7 to describe the reason why the second resonant circuit section 22 has one resonant frequency $f_{2r}$ and two anti-resonant frequencies $f_{2L}$ and $f_{2aH}$. FIG. 7 is a circuit diagram illustrating an equivalent circuit of the second resonant circuit section 22. This diagram ignores any resistive components in the second resonant circuit section 22. As shown in FIG. 7, the second acoustic wave resonator R2 can be represented as a circuit composed of one inductor L1 and two capacitors C0 and C1. The second acoustic wave resonator R2 has a first end and a second end located opposite to each other in terms of circuit configuration. One end of the inductor L1 and one end of the capacitor C0 are connected to the first end of the second acoustic wave resonator R2. One end of the capacitor C1 is connected to the other end of the inductor L1. The other end of the capacitor C1 and the other end of the capacitor C0 are connected to the second end of the second acoustic wave resonator R2. The inductor L2 is connected in parallel to the second acoustic wave resonator R2.

If $L_1$ denotes the inductance of the inductor L1, $C_0$ denotes the capacitance of the capacitor C0, $C_1$ denotes the capacitance of the capacitor C1, $L_m$ denotes the inductance of the inductor L2, and Z denotes the impedance of the second resonant circuit section 22, then:

$$1/Z = (1/j\omega L_m) + j\omega C_0 + [1/\{j\omega L_1 + (1/j\omega C_1)\}] \quad (1)$$

with ω being an angular frequency, j being an imaginary unit.

Transforming Equation (1) above gives Equation (2) below.

$$Z = j\omega L_m(1-\omega^2 L_1 C_1)/\{1-\omega^2(L_1C_1+L_mC_1+L_mC_0)+\omega^4 L_1 L_m C_1 C_0\} \quad (2)$$

The resonant frequency $f_{2r}$ of the second resonant circuit section 22 is obtained from the angular frequency co at which the numerator of Equation (2) is 0, and expressible by Equation (3) below.

$$f_{2r} = 1/\{2\pi\sqrt{(L_1C_1)}\} \quad (3)$$

If we let fa represent the anti-resonant frequency of the second resonant circuit section 22, fa is obtained from the angular frequency w at which the denominator of Equation (2) is 0, and expressible by Equation (4) below:

$$fa = (\sqrt{X})/2\pi \quad (4)$$

with X being expressible by Equation (5) below:

$$X = \{B \pm \sqrt{(B^2-4A)}\}/2A \quad (5)$$

with A and B being expressible by Equations (6) and (7) below, respectively:

$$A = L_1 L_m C_1 C_0 \quad (6)$$

$$B = L_1 C_1 + L_m C_1 + L_m C_0 \quad (7).$$

From Equation (5), there are two solutions for X. Therefore, there are also two solutions for fa expressible by Equation (4). The two solutions are the two anti-resonant frequencies $f_{2aL}$ and $f_{2aH}$.

By way of example, if we assume $C_0=1.26$ pF, $L_m=1.9$ nH, $L_1=91.87$ nH and $C_1=0.0562$ pF, then: $f_{2r}=2215.0$ MHz; $f_{2aL}=2174.7$ MHz; and $f_{2aH}=3313.1$ MHz.

Figure 8:
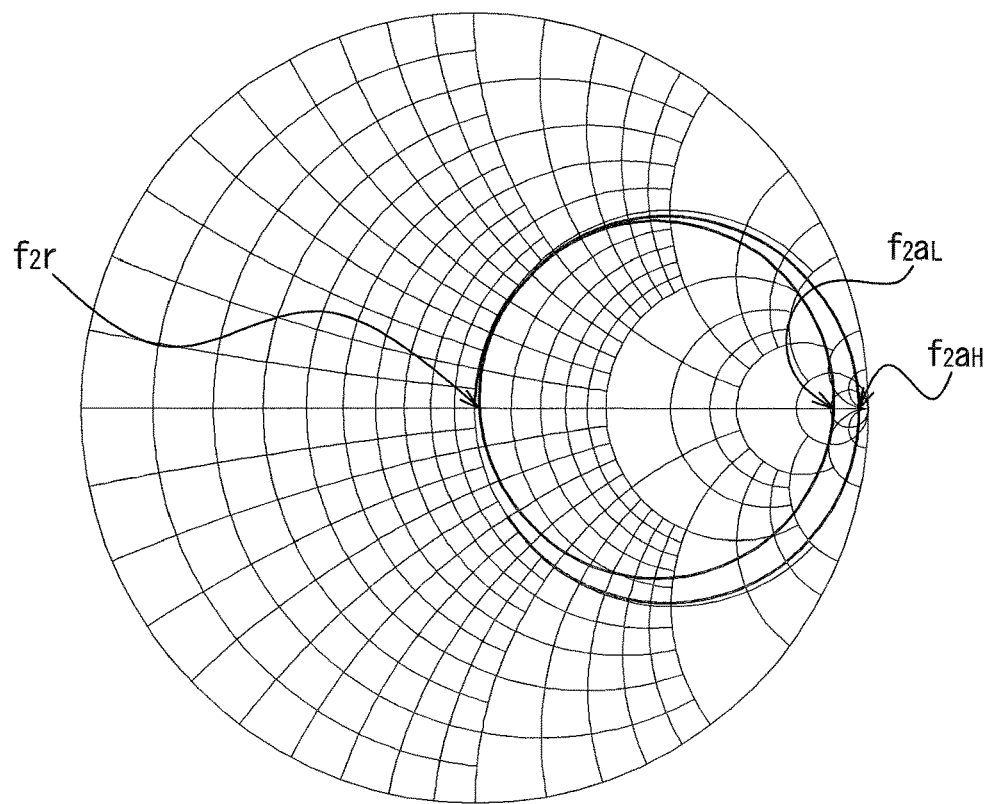
FIG. 8 is an explanatory diagram illustrating an impedance characteristic of a second resonant circuit section of the branching filter shown in FIG. 1.

FIG. 8 is a Smith chart showing the impedance characteristic of the second resonant circuit section 22. In FIG. 8, the point $f_{2r}$ indicates the impedance of the second resonant circuit section 22 at the resonant frequency $f_{2r}$, the point $f_{2L}$, indicates the impedance of the second resonant circuit section 22 at the anti-resonant frequency $f_{2aL}$, and the point $f_{2aH}$ indicates the impedance of the second resonant circuit section 22 at the anti-resonant frequency $f_{2aH}$.

Figure 9:
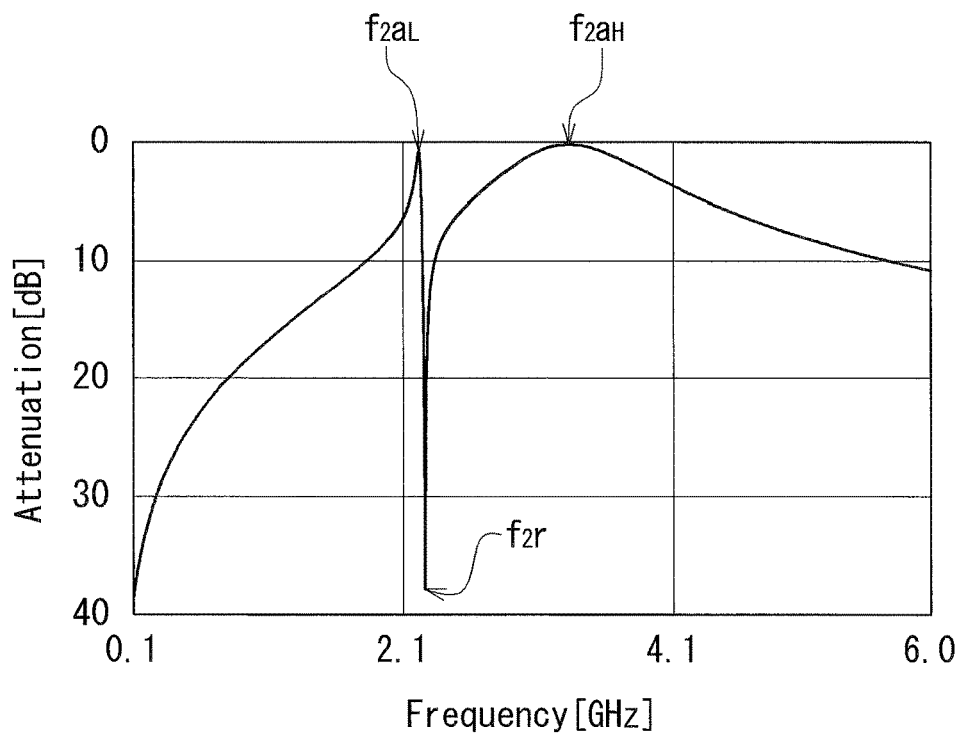
FIG. 9 is a characteristic diagram illustrating the characteristic of the second resonant circuit section of the branching filter shown in FIG. 1.

FIG. 9 illustrates the return loss characteristic of the second resonant circuit section 22. In FIG. 9 the horizontal axis represents frequency, and the vertical axis represents attenuation. In FIG. 9, the point $f_{2r}$ indicates the return loss of the second resonant circuit section 22 at the resonant frequency $f_{2r}$, the point $f_{2aL}$ indicates the return loss of the second resonant circuit section 22 at the anti-resonant frequency $f_{2aL}$, and the point $f_{2aH}$ indicates the return loss of the second resonant circuit section 22 at the anti-resonant frequency $f_{2aH}$.

As shown in FIGS. 3 and 4, the resonant frequency $f_{2r}$ of the second resonant circuit section 22 is within the second passband PB2. The anti-resonant frequency $f_{2aL}$ of the second resonant circuit section 22 is lower than the second low-band cut-off frequency $f_{2L}$. The anti-resonant frequency $f_{2aH}$ of the second resonant circuit section 22 is higher than the second high-band cut-off frequency $f_{2H}$. The insertion loss characteristic 52 of the second band-pass filter 20 shows a first attenuation pole at the anti-resonant frequency $f_{2aL}$. The resonant frequency $f_{2C}$ of the second LC resonant circuit 21 is lower than the anti-resonant frequency $f_{2aL}$. The insertion loss characteristic 52 of the second band-pass filter 20 shows a second attenuation pole at the resonant frequency $f_{2C}$.

The resonant frequency $f_{2r}$ and the anti-resonant frequency $f_{2aL}$ are relatively close to each other. Thus, setting the resonant frequency $f_{2r}$ and the anti-resonant frequency $f_{2aL}$ as above makes the resonant frequency $f_{2r}$ be located within the second passband PB2 and close to the second low-band cut-off frequency $f_{2L}$, and makes the anti-resonant frequency $f_{2aL}$ be located outside the second passband PB2 and close to the second low-band cut-off frequency $f_{2L}$. As a result, as shown in FIGS. 3 and 4, in a frequency region close to the second low-band cut-off frequency $f_{2L}$, the second band-pass filter 20 provides a small insertion loss at the resonant frequency $f_{2r}$ which is within the second passband PB2 and a large insertion loss at the anti-resonant frequency $f_{2aL}$ which is outside the second passband PB2. The second band-pass filter 20 thus has an insertion loss characteristic that shows a small insertion loss in the second passband PB2 and that abruptly changes in a frequency region close to the second low-band cut-off frequency $f_{2L}$.

As shown in FIG. 3, the insertion loss characteristic 52 of the second band-pass filter 20 shows a third attenuation pole at the anti-resonant frequency $f_{2aH}$. As a result, the insertion loss characteristic of the second band-pass filter 20 shows a large insertion loss in a frequency region higher than the second passband PB2.

For a band-pass filter formed using an LC filter including no acoustic wave resonator, any attempts to achieve an insertion loss characteristic that abruptly changes in a frequency region close to the cut-off frequency would necessitate a large number of stages or a large inductor to obtain a high Q value. This would result in upsizing of the band-pass filter.

In the present embodiment, the first band-pass filter 10 includes the first acoustic wave resonator R1, and the second band-pass filter 20 includes the second acoustic wave resonator R2. When compared with LC resonators, acoustic wave resonators are typically able to provide higher Q values. More specifically, typical LC resonators provide Q values in the range of 50 to 100, whereas acoustic wave resonators provide Q values of 200 or higher. The first and second acoustic wave resonators R1 and R2 provide Q values of 200 or higher, e.g., 600 to 1000. The present embodiment thus achieves the above-described insertion loss characteristics of the first and second band-pass filters 10 and 20 without upsizing the inductors or increasing the number of stages.

The present embodiment thus provides the branching circuit 1 which is suitable to separate two signals in two mutually relatively close frequency bands from each other and is miniaturizable.

In the first band-pass filter 10 of the branching filter 1 according to the present embodiment, the first LC resonant circuit 11 and the first resonant circuit section 12 are provided between the common port 2 and the first signal port 3 and arranged in series in this order from the common-port-2 side. In the second band-pass filter 20, the second LC resonant circuit 21 and the second resonant circuit section 22 are provided between the common port 2 and the second signal port 4 and arranged in series in this order from the common-port-2 side. Such a configuration provides advantages as described below.

The first band-pass filter 10 requires impedance characteristic adjustments so that in the first passband PB1 the reflection coefficient of the first signal path as viewed from the common port 2 has an absolute value of 0 or near 0, and in the second passband PB2 the reflection coefficient of the first signal path as viewed from the common port 2 has an absolute value of 1 or near 1. The second band-pass filter 20 requires impedance characteristic adjustments so that in the second passband PB2 the reflection coefficient of the second signal path as viewed from the common port 2 has an absolute value of 0 or near 0, and in the first passband PB1 the reflection coefficient of the second signal path as viewed from the common port 2 has an absolute value of 1 or near 1.

Typically, when compared with LC resonant circuits, acoustic wave resonators show a greater change in impedance with respect to a change in frequency. Thus, if the first resonant circuit section 12 is present between the first LC resonant circuit 11 and the connection point between the band-pass filters 10 and 20 and the second resonant circuit section 22 is present between the second LC resonant circuit 21 and the connection point between the band-pass filters 10 and 20, it becomes difficult to perform the above-described impedance characteristic adjustments in both of the band-pass filters 10 and 20.

In the present embodiment, in contrast, the first LC resonant circuit 11 is present between the first resonant circuit section 12 and the connection point between the band-pass filters 10 and 20, and the second LC resonant circuit 21 is present between the second resonant circuit section 22 and the connection point between the band-pass filters 10 and 20. This configuration makes it easy to perform the above-described impedance characteristic adjustments in both of the band-pass filters 10 and 20.

In the present embodiment, the first band-pass filter 10 may be formed in a variety of different configurations including, but not limited to, the configuration shown in FIG. 1 as long as the first LC resonant circuit 11 and the first resonant circuit section 12 are included and the intended characteristics of the first band-pass filter 10 are achieved.

Likewise, the second band-pass filter 20 may be formed in a variety of different configurations including, but not limited to, the configuration shown in FIG. 1 as long as the second LC resonant circuit 21 and the second resonant circuit section 22 are included and the intended characteristics of the second band-pass filter 20 are achieved.

The branching filter of the present invention may include a band-pass filter or high-pass filter of any configuration, in place of the second band-pass filter 20. The branching filter in this case provides at least the effect that the first band-pass filter 10 achieves an insertion loss characteristic that shows a small insertion loss in the first passband PB1 and that abruptly changes in a frequency region close to the first high-band cut-off frequency $f_{1H}$.

The branching filter of the present invention may include a band-pass filter or low-pass filter of any configuration, in place of the first band-pass filter 10. The branching filter in this case provides at least the effect that the second band-pass filter 20 achieves an insertion loss characteristic that shows a small insertion loss in the second passband PB2 and that abruptly changes in a frequency region close to the second low-band cut-off frequency $f_{2L}$.

Second Embodiment

Figure 10:
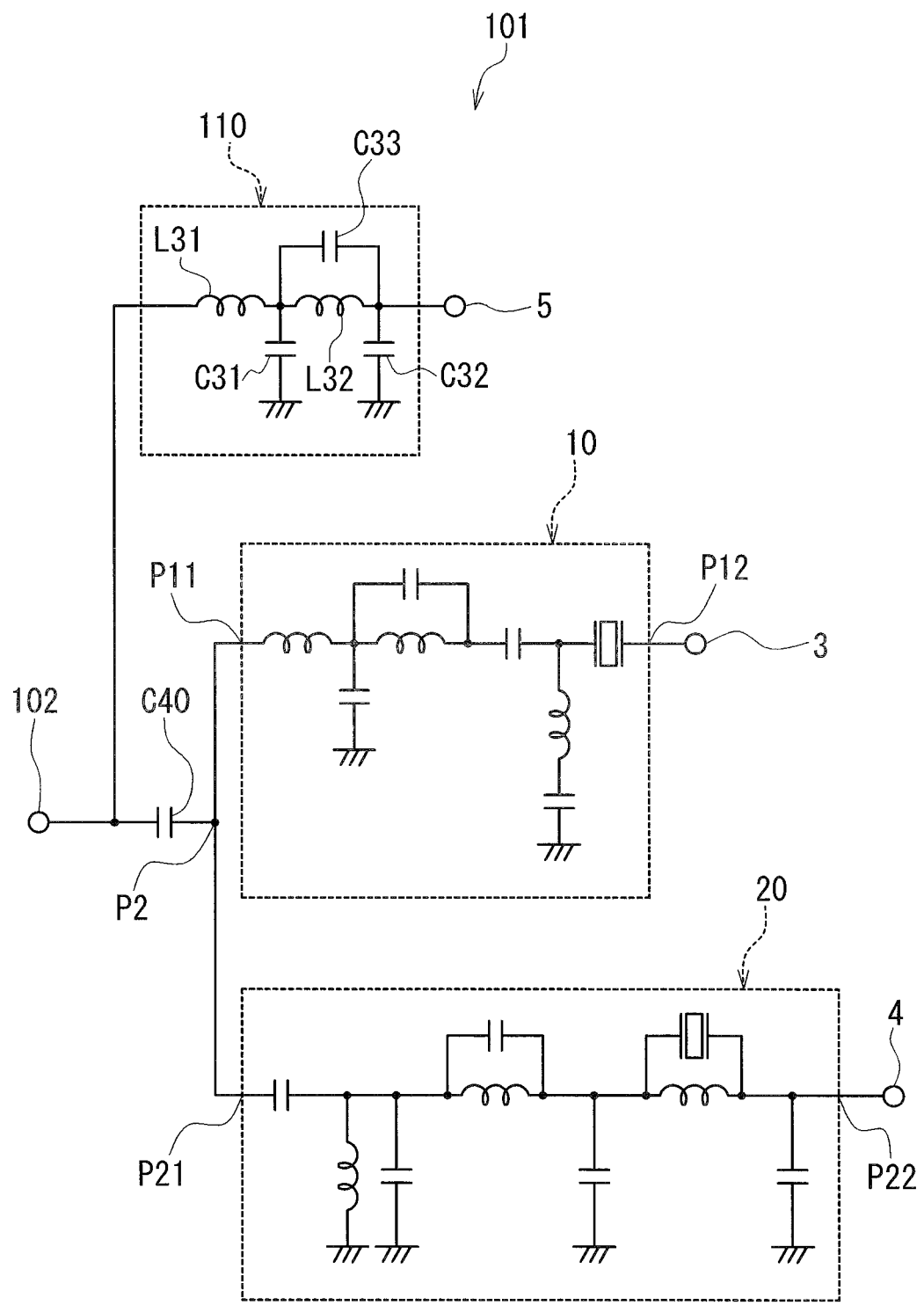
FIG. 10 is a circuit diagram illustrating the configuration of a branching filter according to a second embodiment of the invention.

A branching filter according to a second embodiment of the invention will now be described. FIG. 10 is a circuit diagram illustrating the configuration of the branching filter according to the second embodiment. The branching filter 101 according to the second embodiment is configured to separate three signals of frequencies within three mutually different frequency bands from each other. The three mutually different frequency bands will be referred to as the low band, the middle band, and the high band, from lowest to highest.

The branching filter 101 according to the second embodiment includes a common port 102, a first signal port 3, and a third signal port 5. The branching filter 101 further includes a low-pass filter 110, a first band-pass filter 10, a second band-pass filter 20, and a capacitor C40. The first and second band-pass filters 10 and 20 are configured in the same manner as in the first embodiment.

The low-pass filter 110 is provided between the common port 102 and the third signal port 5. The low-pass filter 110 includes inductors L31 and L32 and capacitors C31, C32 and C33. The inductors L31 and L32 are provided in series between the common port 102 and the third signal port 5. The capacitor C31 is provided between the ground and the connection point between the inductors L31 and L32. The capacitor C32 is provided between the third signal port 5 and the ground. The capacitor C33 is connected in parallel to the inductor L32.

One end of the capacitor C40 is connected to the common port 102. The first port P11 of the first band-pass filter 10 and the first port P21 of the second band-pass filter 20 are connected to the other end of the capacitor C40. The second port P12 of the first band-pass filter 10 is connected to the first signal port 3. The second port P22 of the second band-pass filter 20 is connected to the second signal port 4.

The low-pass filter 110 selectively passes signals of frequencies within the low band. The first band-pass filter 10 selectively passes signals of frequencies within the middle band and signals of frequencies within the high band. The second band-pass filter 20 selectively passes signals of frequencies within the high band.

Now, the path leading from the common port 102 to the third signal port 5 via the low-pass filter 110 will be referred to as the low band path. The path leading from the common port 102 to the first signal port 3 via the capacitor C40 and the first band-pass filter 10 will be referred to as the middle band path. The path leading from the common port 102 to the second signal port 4 via the capacitor C40 and the second band-pass filter 20 will be referred to as the high band path. Signals of frequencies within the low band selectively pass through the low band path. Signals of frequencies within the middle band selectively pass through the middle band path. Signals of frequencies within the high band selectively pass through the high band path.

The connection point between the first band-pass filter 10 and the second band-pass filter 20 will be referred to as the port P2. In the second embodiment, the port P2 corresponds to the common port of the present invention.

Figure 11:
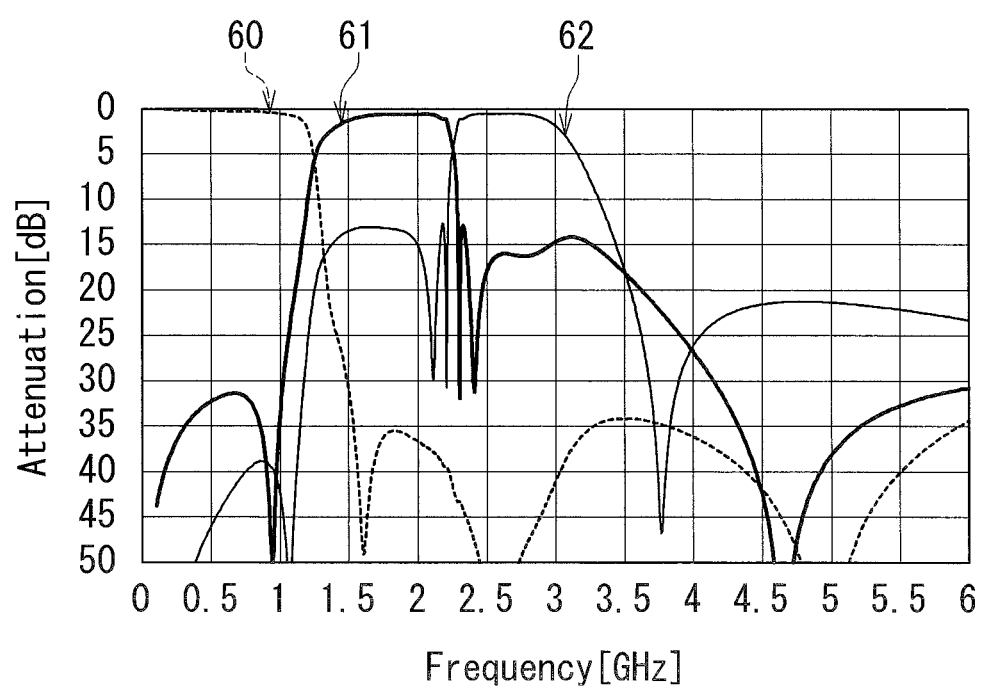
FIG. 11 is a characteristic diagram illustrating an example of characteristics of the branching filter according to the second embodiment of the invention.

FIG. 11 is a characteristic diagram illustrating an example of characteristics of the branching filter 101. In FIG. 11, the horizontal axis represents frequency, and the vertical axis represents attenuation. In FIG. 11, the curve 60 shows the insertion loss characteristic of the low band path, the curve 61 shows the insertion loss characteristic of the middle band path, and the curve 62 shows the insertion loss characteristic of the high band path. The characteristics shown in FIG. 11 were determined by simulation.

The remainder of configuration, operation and effects of the second embodiment are similar to those of the first embodiment.

Third Embodiment

Figure 12:
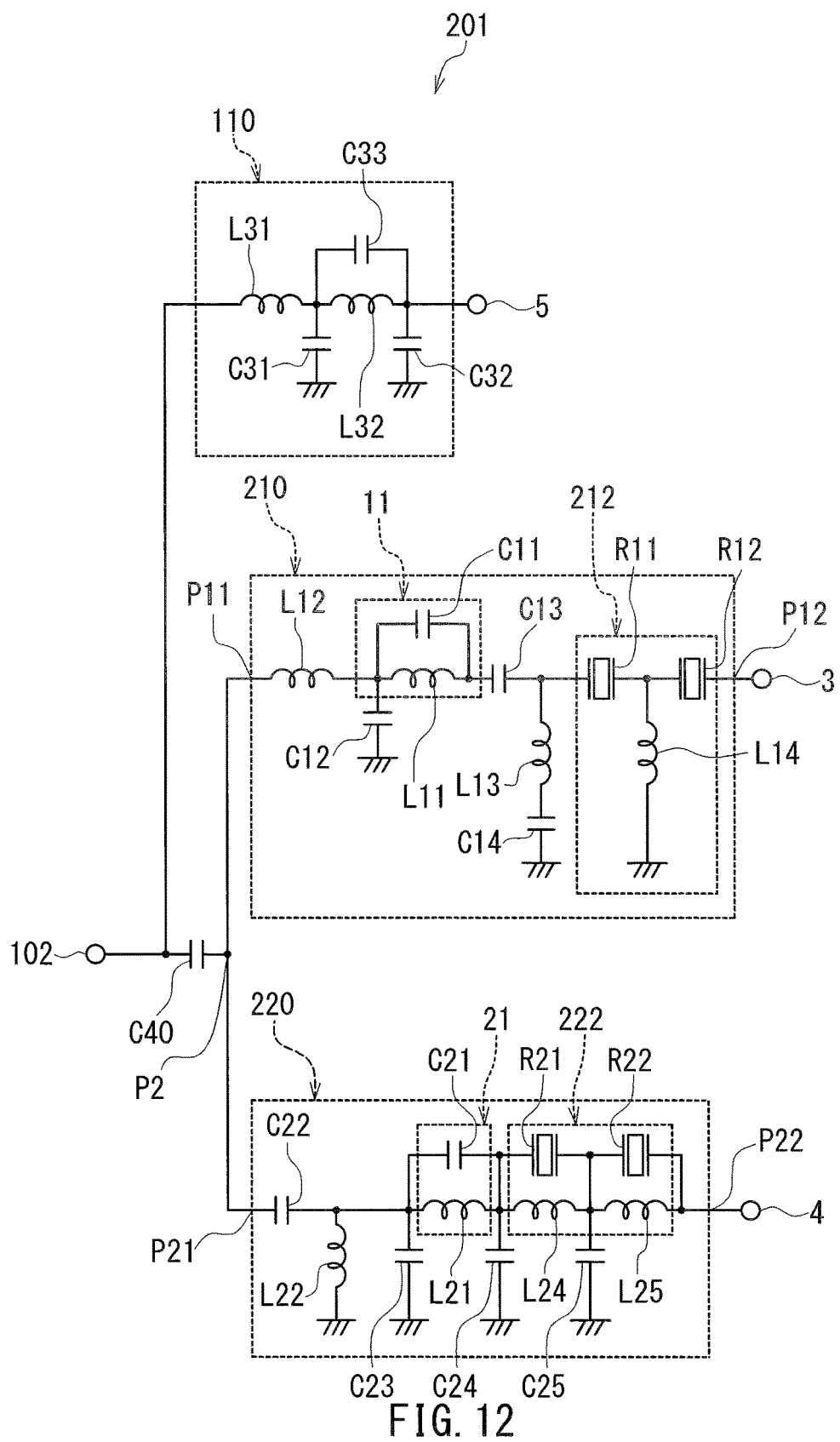
FIG. 12 is a circuit diagram illustrating the configuration of a branching filter according to a third embodiment of the invention.

A branching filter according to a third embodiment of the invention will now be described. FIG. 12 is a circuit diagram illustrating the configuration of the branching filter according to the third embodiment. The branching filter 201 according to the third embodiment is configured to separate three signals of frequencies within three frequency bands, i.e., the low band, the middle band and the high band from each other, as in the second embodiment.

The branching filter 201 according to the third embodiment includes a first band-pass filter 210 in place of the first band-pass filter 10 of the second embodiment, and a second band-pass filter 220 in place of the second band-pass filter 20 of the second embodiment.

The low-pass filter 110 selectively passes signals of frequencies within the low band. The first band-pass filter 210 selectively passes signals of frequencies within the middle band and signals of frequencies within the high band. The second band-pass filter 220 selectively passes signals of frequencies within the high band.

Now, the path leading from the common port 102 to the third signal port 5 via the low-pass filter 110 will be referred to as the low band path. The path leading from the common port 102 to the first signal port 3 via the capacitor C40 and the first band-pass filter 210 will be referred to as the middle band path. The path leading from the common port 102 to the second signal port 4 via the capacitor C40 and the second band-pass filter 220 will be referred to as the high band path. Signals of frequencies within the low band selectively pass through the low band path. Signals of frequencies within the middle band selectively pass through the middle band path. Signals of frequencies within the high band selectively pass through the high band path.

The connection point between the first band-pass filter 210 and the second band-pass filter 220 will be referred to as the port P2. In the third embodiment, the port P2 corresponds to the common port of the present invention.

The first band-pass filter 210 includes a first resonant circuit section 212 in place of the first resonant circuit section 12 of the first band-pass filter 10 of the first embodiment. The first resonant circuit section 212 includes two first acoustic wave resonators R11 and R12 connected in series. The acoustic wave resonators R11 and R12 are provided in the path leading from the first LC resonant circuit 11 to the second port P12, i.e., the path leading from the first LC resonant circuit 11 to the first signal port 3, and arranged in the order of R11 and R12 from the side of the first LC resonant circuit 11.

The acoustic wave resonators R11 and R12 are resonators formed using acoustic wave elements. The acoustic wave elements used to form the acoustic wave resonators R11 and R12 may be surface acoustic wave elements or bulk acoustic wave elements.

The first resonant circuit section 212 further includes an inductor L14. The inductor L14 is provided between the ground and the connection point between the acoustic wave resonators R11 and R12.

The second band-pass filter 220 includes a second resonant circuit section 222 in place of the second resonant circuit section 22 of the second band-pass filter 20 of the first embodiment. The second resonant circuit section 222 includes two second acoustic wave resonators R21 and R22 connected in series. The acoustic wave resonators R21 and R22 are provided in the path leading from the second LC resonant circuit 21 to the second port P22, i.e., the path leading from the second LC resonant circuit 21 to the second signal port 4, and arranged in the order of R21 and R22 from the side of the second LC resonant circuit 21.

The acoustic wave resonators R21 and R22 are resonators formed using acoustic wave elements. The acoustic wave elements used to form the acoustic wave resonators R21 and R22 may be surface acoustic wave elements or bulk acoustic wave elements.

The second resonant circuit section 222 further includes an inductor L24 connected in parallel to the acoustic wave resonator R21, and an inductor L25 connected in parallel to the acoustic wave resonator R22.

The second band-pass filter 220 further includes a capacitor C25. The capacitor C25 is provided between the ground and the connection point between the acoustic wave resonators R21 and R22.

Figure 13:
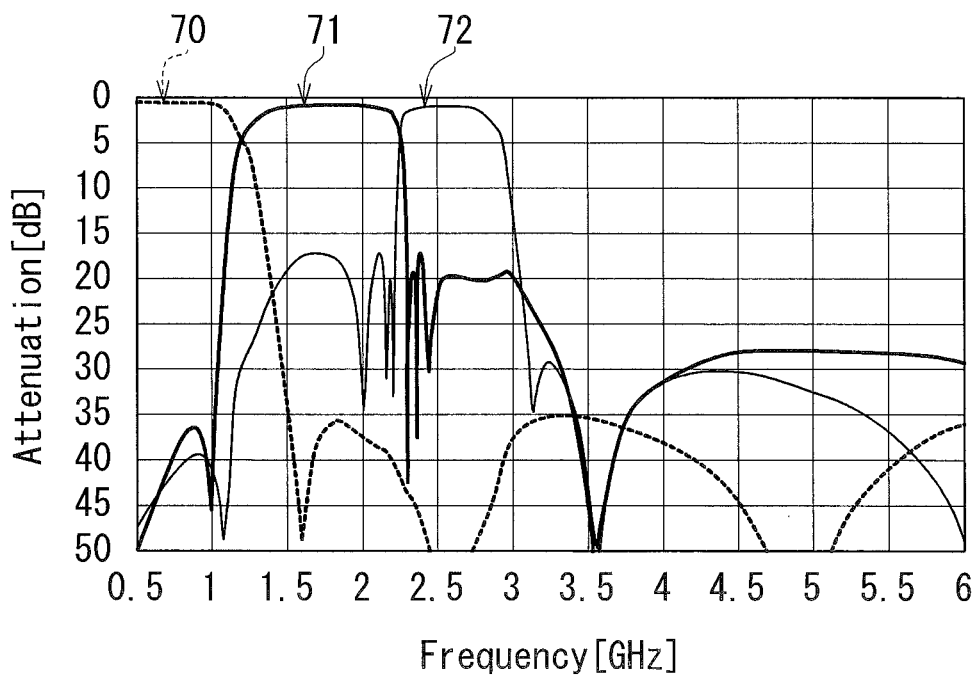
FIG. 13 is a characteristic diagram illustrating an example of characteristics of the branching filter according to the third embodiment of the invention.
Figure 14:
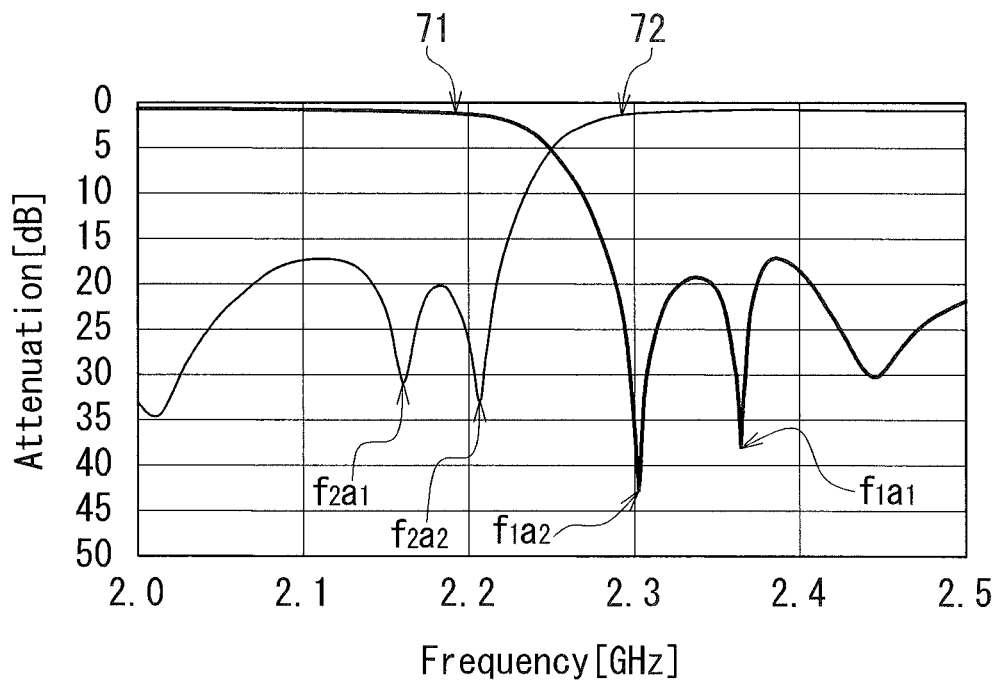
FIG. 14 is a characteristic diagram providing an enlarged view of a portion of the characteristic shown in FIG. 13.

FIG. 13 is a characteristic diagram illustrating an example of characteristics of the branching filter 201. FIG. 14 is a characteristic diagram providing an enlarged view of a portion of the characteristic shown in FIG. 13. In FIGS. 13 and 14, the horizontal axis represents frequency, and the vertical axis represents attenuation. In FIG. 13, the curve 70 shows the insertion loss characteristic of the low band path, the curve 71 shows the insertion loss characteristic of the middle band path, and the curve 72 shows the insertion loss characteristic of the high band path. The characteristics shown in FIGS. 13 and 14 were determined by simulation.

The first resonant circuit section 212 has a resonant frequency $f_{1r}$ within the first passband PB1, and two anti-resonant frequencies $f_{1a1}$ and $f_{1a2}$ higher than the first high-band cut-off frequency $f_{1H}$. The anti-resonant frequency $f_{1a1}$ is the anti-resonant frequency of the acoustic wave resonator R11. The anti-resonant frequency $f_{1a2}$ is the anti-resonant frequency of the acoustic wave resonator R12. As shown in FIG. 14, the insertion loss characteristic 71 of the middle band path shows two attenuation poles at the two anti-resonant frequencies $f_{1a1}$ and $f_{1a2}$.

The first resonant circuit section 212 preferably includes an element for changing impedance between the acoustic wave resonators R11 and R12 so that the acoustic wave resonators R11 and R12 have mutually different anti-resonant frequencies. The inductor L14 shown in FIG. 12 is preferably used as the element for changing impedance. The second resonant circuit section 222 has a resonant frequency $f_{2r}$ within the second passband PB2, and two anti-resonant frequencies $f_{2a1}$ and $f_{2a2}$ lower than the second low-band cut-off frequency $f_{2L}$. The anti-resonant frequency $f_{2a1}$ is one of the anti-resonant frequencies of a circuit composed of the acoustic wave resonator R21 and the inductor L24. The anti-resonant frequency $f_{2a2}$ is one of the anti-resonant frequencies of a circuit composed of the acoustic wave resonator R22 and the inductor L25. As shown in FIG. 14, the insertion loss characteristic 72 of the high band path shows two attenuation poles at the two anti-resonant frequencies $f_{2a1}$ and $f_{2a2}$.

The third embodiment allows the first band-pass filter 210 to provide an insertion loss characteristic that changes more abruptly in a frequency region close to the first high-band cut-off frequency $f_{1H}$ than does the insertion loss characteristic of the first band-pass filter 10 of the second embodiment. The third embodiment also allows the second band-pass filter 220 to provide an insertion loss characteristic that changes more abruptly in a frequency region close to the second low-band cut-off frequency $f_{2L}$ than does the insertion loss characteristic of the second band-pass filter 20 of the second embodiment.

The remainder of configuration, operation and effects of the third embodiment are similar to those of the first or second embodiment.

The present invention is not limited to the foregoing embodiments, and various modifications may be made thereto. For example, characteristics of the first and second band-pass filters in the present invention are not limited to those illustrated in the foregoing embodiments, and can be freely designed as far as the the requirements of the appended claims are met.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A band-pass filter configured to selectively pass a signal of a frequency within a passband not lower than a low-band cut-off frequency and not higher than a high-band cut-off frequency, comprising:
    a first port;
    a second port; and
    an LC resonant circuit and a resonant circuit section provided in series between the first port and the second port, wherein
    the resonant circuit section includes at least one acoustic wave resonator provided in a path leading from the first port to the second port,
    the resonant circuit section has a resonant frequency and at least one anti-resonant frequency,
    the resonant frequency is within the passband,
    the at least one anti-resonant frequency is outside the passband, and
    the LC resonant circuit is an LC parallel resonant circuit having a resonant frequency outside the passband.

2. A band-pass filter configured to selectively pass a signal of a frequency within a passband not lower than a low-band cut-off frequency and not higher than a high-band cut-off frequency, comprising:
    a first port;
    a second port; and
    an LC resonant circuit and a resonant circuit section provided in series between the first port and the second port, wherein
    the resonant circuit section includes at least one acoustic wave resonator provided in a path leading from the first port to the second port,
    the resonant circuit section has a resonant frequency and at least one anti-resonant frequency,
    the resonant frequency is within the passband, and
    the at least one anti-resonant frequency is outside the passband, and is higher than the high-band cut-off frequency.

3. The band-pass filter according to claim 2, wherein the resonant circuit section includes two acoustic wave resonators connected in series, as the at least one acoustic wave resonator.

4. A band-pass filter configured to selectively pass a signal of a frequency within a passband not lower than a low-band cut-off frequency and not higher than a high-band cut-off frequency, comprising:
- a first port;
- a second port; and
- an LC resonant circuit and a resonant circuit section provided in series between the first port and the second port, wherein
- the resonant circuit section includes at least one acoustic wave resonator provided in a path leading from the first port to the second port,
- the resonant circuit section has a resonant frequency and at least one anti-resonant frequency,
- the resonant frequency is within the passband,
- the at least one anti-resonant frequency is outside the passband,
- the resonant circuit section further includes at least one inductor connected in parallel to the at least one acoustic wave resonator, and
- the resonant circuit section has an anti-resonant frequency lower than the low-band cut-off frequency and an anti-resonant frequency higher than the high-band cut-off frequency, as the at least one anti-resonant frequency.

5. The band-pass filter according to claim 4, wherein the resonant circuit section includes, as the at least one acoustic wave resonator, two acoustic wave resonators connected in series, and as the at least one inductor, two inductors respectively connected in parallel to the two acoustic wave resonators.

6. A branching filter comprising:
- a common port;
- a first signal port;
- a second signal port;
- a first filter provided between the common port and the first signal port, and configured to selectively pass a signal of a frequency within a first passband; and
- a second filter provided between the common port and the second signal port, and configured to selectively pass a signal of a frequency within a second passband higher than the first passband, wherein
- the first filter is a first band-pass filter,
- the first passband is a frequency band that is not lower than a first low-band cut-off frequency and not higher than a first high-band cut-off frequency,
- the first band-pass filter includes a first LC resonant circuit and a first resonant circuit section between the common port and the first signal port, the first LC resonant circuit and the first resonant circuit section being arranged in series in this order from the common-port side,
- the first resonant circuit section includes at least one acoustic wave resonator provided in a path leading from the first LC resonant circuit to the first signal port, and
- the first resonant circuit section has a resonant frequency within the first passband and at least one anti-resonant frequency higher than the first high-band cut-off frequency.

7. The branching filter according to claim 6, wherein the first LC resonant circuit is a first LC parallel resonant circuit having a resonant frequency higher than the first high-band cut-off frequency.

8. The branching filter according to claim 6, wherein the first resonant circuit section includes two acoustic wave resonators connected in series, as the at least one acoustic wave resonator.

9. A branching filter comprising:
- a common port;
- a first signal port;
- a second signal port;
- a first filter provided between the common port and the first signal port, and configured to selectively pass a signal of a frequency within a first passband; and
- a second filter provided between the common port and the second signal port, and configured to selectively pass a signal of a frequency within a second passband higher than the first passband, wherein
- the second filter is a second band-pass filter,
- the second passband is a frequency band that is not lower than a second low-band cut-off frequency and not higher than a second high-band cut-off frequency,
- the second band-pass filter includes a second LC resonant circuit and a second resonant circuit section between the common port and the second signal port, the second LC resonant circuit and the second resonant circuit section being arranged in series in this order from the common-port side,
- the second resonant circuit section includes at least one acoustic wave resonator provided in a path leading from the second LC resonant circuit to the second signal port, and at least one inductor connected in parallel to the at least one acoustic wave resonator, and
- the second resonant circuit section has a resonant frequency within the second passband, an anti-resonant frequency lower than the second low-band cut-off frequency, and an anti-resonant frequency higher than the second high-band cut-off frequency.

10. The branching filter according to claim 9, wherein the second LC resonant circuit is a second LC parallel resonant circuit having a resonant frequency lower than the second low-band cut-off frequency.

11. The branching filter according to claim 9, wherein the second resonant circuit section includes, as the at least one acoustic wave resonator, two acoustic wave resonators connected in series, and as the at least one inductor, two inductors respectively connected in parallel to the two acoustic wave resonators.

12. A branching filter comprising:
- a common port;
- a first signal port;
- a second signal port;
- a first filter provided between the common port and the first signal port, and configured to selectively pass a signal of a frequency within a first passband; and
- a second filter provided between the common port and the second signal port, and configured to selectively pass a signal of a frequency within a second passband higher than the first passband, wherein
- the first filter is a first band-pass filter,
- the first passband is a frequency band that is not lower than a first low-band cut-off frequency and not higher than a first high-band cut-off frequency,
- the first band-pass filter includes a first LC resonant circuit and a first resonant circuit section between the common port and the first signal port, the first LC resonant circuit and the first resonant circuit section being arranged in series in this order from the common-port side, the first resonant circuit section includes at least one first acoustic wave resonator provided in a path leading from the first LC resonant circuit to the first signal port, the first resonant circuit section has a resonant frequency within the first passband and at least one anti-resonant frequency higher than the first high-band cut-off frequency, the second filter is a second band-pass filter, the second passband is a frequency band that is not lower than a second low-band cut-off frequency and not higher than a second high-band cut-off frequency, the second band-pass filter includes a second LC resonant circuit and a second resonant circuit section between the common port and the second signal port, the second LC resonant circuit and the second resonant circuit section being arranged in series in this order from the common-port side, the second resonant circuit section includes at least one second acoustic wave resonator provided in a path leading from the second LC resonant circuit to the second signal port, and at least one inductor connected in parallel to the at least one second acoustic wave resonator, and the second resonant circuit section has a resonant frequency within the second passband, an anti-resonant frequency lower than the second low-band cut-off frequency, and an anti-resonant frequency higher than the second high-band cut-off frequency.

13. The branching filter according to claim 12, wherein
the first LC resonant circuit is a first LC parallel resonant circuit having a resonant frequency higher than the first high-band cut-off frequency, and the second LC resonant circuit is a second LC parallel resonant circuit having a resonant frequency lower than the second low-band cut-off frequency.

14. The branching filter according to claim 12, wherein
the first resonant circuit section includes, as the at least one first acoustic wave resonator, two first acoustic wave resonators connected in series, and the second resonant circuit section includes, as the at least one second acoustic wave resonator, two second acoustic wave resonators connected in series, and as the at least one inductor, two inductors respectively connected in parallel to the two second acoustic wave resonators.

* * * * *